United States Patent
Glejbøl

[11] Patent Number: 5,935,455
[45] Date of Patent: Aug. 10, 1999

[54] METHOD AND AN ELECTRODE SYSTEM FOR EXCITATION OF A PLASMA

[75] Inventor: Kristian Glejbøl, Albertslund, Denmark

[73] Assignee: NKT Research Center A/S, Brondby, Denmark

[21] Appl. No.: 08/641,565

[22] Filed: May 1, 1996

[30] Foreign Application Priority Data

May 2, 1995 [NO] Norway .................................. 951682

[51] Int. Cl.[6] .............................. C23C 16/50; H05H 1/10; H05H 1/36
[52] U.S. Cl. ............ 216/71; 118/723 MP; 118/723 MA; 118/723 E; 134/1.1; 315/111.21; 427/569; 427/571
[58] Field of Search ............................ 118/702, 723 MP, 118/723 MW, 723 MA, 723 E; 156/345; 134/1.1, 1.2; 204/192.12, 192.32, 298.06, 298.08, 298.34; 216/71; 315/111.71, 111.21; 427/569, 571, 575; 438/729

[56] References Cited

U.S. PATENT DOCUMENTS

| | | | |
|---|---|---|---|
| 5,330,606 | 7/1994 | Kubota et al. | 156/345 |
| 5,404,079 | 4/1995 | Ohkumi et al. | 315/111.81 |
| 5,452,177 | 9/1995 | Frutiger | 361/234 |
| 5,535,906 | 7/1996 | Drummond | 216/67 |
| 5,609,690 | 3/1997 | Watanabe et al. | 118/723 E |
| 5,677,236 | 10/1997 | Saitoh et al. | 437/109 |
| 5,801,489 | 9/1998 | Chism, Jr. et al. | 315/111.21 |

FOREIGN PATENT DOCUMENTS

95/32315   11/1995   WIPO .

*Primary Examiner*—Jeffrey E. Russel
*Attorney, Agent, or Firm*—Ladas & Parry

[57] ABSTRACT

A method for excitation of a plasma, characterized in that it comprises the step of subjecting a gas to an electric field generated by an electrode system comprising n electrodes, n being an integer greater than or equal to 3, preferably between 3 and 30, each of the n electrodes being connected to one of the following AC voltages:

$$U_r(t) = U_0 \sin(2\pi f \cdot t)$$
$$U_s(t) = U_0 \sin\left(2\pi f \cdot t + \frac{2\pi}{3}\right)$$
$$U_t(t) = U_0 \sin\left(2\pi f \cdot t - \frac{2\pi}{3}\right)$$

where:
f is a frequency in the range of 10 to 10000 Hz, preferably 30 to 200 Hz, more preferably 50 to 60 Hz, $U_0$ is a voltage in the range of 50 to 10000 V,
at least one electrode being connected to $U_r$, at least one electrode being connected to Us and at least one electrode being connected to $U_t$. The invention also concerns an electrode system for carrying out the method.

18 Claims, 3 Drawing Sheets

METHOD AND AN ELECTRODE SYSTEM FOR EXCITATION OF A PLASMA

The present invention concerns a method and an electrode system for excitation of a plasma.

DC excitation of a gas is a technique commonly used for generating a plasma. A plasma of this kind is normally referred to as a "DC plasma".

The method normally used for generating a DC plasma involves subjecting an optionally heated gas to a DC electric field maintained between two electrodes where one of the two electrodes may be a chamber wall. The equipment employed for this purpose mainly consists of two electrodes connected to a DC power supply.

Suitable DC power supplies are, however, quite expensive, and in fact one of the major investments when constructing DC plasma excitation equipment is the DC power supply.

It has now surprisingly been found that a virtual DC plasma can be generated by a method that does not require the use of a conventional DC power supply.

It is thus an object of the present invention to provide an economically advantageous method for generating a virtual DC plasma.

This object is accomplished by a method by which a gas is subjected to an electric field generated by an electrode system comprising n electrodes, n being an integer greater than or equal to 3, preferably between 3 and 30, each of the n electrodes being connected to one of the following AC voltage.

$$U_r(t) = U_0 \sin(2\pi f \cdot t)$$

$$U_s(t) = U_0 \sin\left(2\pi f \cdot t + \frac{2\pi}{3}\right)$$

$$U_t(t) = U_0 \sin\left(2\pi f \cdot t - \frac{2\pi}{3}\right)$$

where:
f is a frequency in the range of 10 to 10000 Hz, preferably 30 to 200 Hz, more preferably 50 to 60 Hz, $U_0$ is a voltage in the range of 50 to 10000 V,
at least one electrode being connected to $U_r$, at least one electrode being connected to U. and at least one electrode being connected to $U_t$.

Conventional three-phase power lines comprise three voltages normally designated $U_R$, $U_S$ and $U_T$. The phases of these voltages are shifted $\frac{2\pi}{3}$ radians relative to each other. More specifically, the instantaneous voltages associated with the three phases are:

$$U_R(t) = U_0 \sin(2\pi f \cdot t)$$

$$U_S(t) = U_0 \sin\left(2\pi f \cdot t + \frac{2\pi}{3}\right)$$

$$U_T(t) = U_0 \sin\left(2\pi f \cdot t - \frac{2\pi}{3}\right)$$

where t is the time, f is the frequency and $U_0$ is the maximum amplitude.

In the present context the symbols $U_R$, $U_S$ and $U_T$ are used specifically to signify the voltages achievable from conventional power lines whereas the symbols $U_r$, $U_s$ and $U_t$ are used in general to signify the voltages actually applied to the electrodes. Thus, when electrodes are connected directly to the voltages obtained from the power line, $U_r$, $U_s$ and $U_t$ equals $U_R$, $U_S$ and $U_T$, respectively.

In most European countries, for example, the power line frequency (f) approximately equals 50 Hz and the maximum amplitude ($U_0$) approximately equals 220 V. However, the frequency as well as the maximum amplitude of the voltages can easily be converted by standard methods, e.g. by means Of conventional step-up transformers, before the voltages are applied to the electrodes.

The potential difference between any two of the three phases can be expressed in the following ways:

$$V_1(t) = U_r - U_s = \sqrt{3}\, U_0 \sin(2\pi f \cdot t)$$

$$V_2(t) = U_r - U_t = \sqrt{3}\, U_0 \sin\left(2\pi\left(f \cdot t + \frac{1}{3}\right)\right)$$

$$V_3(t) = U_s - U_t = \sqrt{3}\, U_0 \sin\left(2\pi\left(f \cdot t - \frac{1}{5}\right)\right)$$

From these expressions it can be derived that the function $\max(|V_1(t)|,|V_2(t)|,|V_3(t)|)(t)$ is virtually a constant function (relative variation only approximately 6%) or, in other words, that the variation in maximum absolute potential difference between at least two of the phases during any period of time is very small.

Thus, a plasma generated according to the method of the invention, by which three electrodes connected to three different phases are always present, will experience a constant maximum absolute potential difference, except for some insignificant variations (a ripple).

The speed of electrons and ions in a plasma is generally rather high and often more than 1000 m/s. As a result, the time between generation of these charged particles and the annihilation thereof due to contact with the electrodes is very short, typically less than $\frac{1}{10}$ ms, and much shorter than the time constants involved in shifting the voltage between the electrodes. Thus, at a time scale corresponding to the typical lifetime of a charged particle in the plasma, the direction and magnitude of the electric field created by the electrodes appears constant, i.e. the particles experience a virtually static situation similar to that in a conventional DC plasma.

Arcing at the cathode is a major problem often encountered in conventional methods for generating a DC plasma. It has, however, surprisingly been found the arcing is prevented by the method according to the invention. This is presumably due to the fact that during the method according to the invention all electrodes act as anodes as well as cathodes during a cycle ($t_{cycle}=1/f$), and that this prevents formation of hot spots on the electrodes.

Having overcome the disadvantages with respect to arcing by the method of the invention, the method allows application of very high voltages and currents in comparison with ordinary DC excitation techniques.

Another surprising advantage of the method according to the invention is that deposition on the electrodes of unwanted insulating films is prevented. This might be due to the fact that the voltage reversal during a cycle results in a continuous sputtering of the electrodes.

Advantageously, an approximately equal number of electrodes in the electrode arrangement are connected to each of the three voltages $U_r$, $U_s$ and $U_t$, respectively. More specifically it is preferred that i electrodes are connected to $U_r$, j electrodes are connected to $U_s$, k electrodes are connected to $U_t$, where i, j and k are integers from 1 to 28, i+j+k=n, i≧j≧k, i−j<5 and j−k<5. It is even more preferred that i=j=k.

The total number of electrodes in the electrode arrangement is preferably a number which is divisible with 3, more preferably n=3, 6 or 9.

The n electrodes are preferably arranged so that the generated plasma essentially is surrounded by electrodes. It is even more preferred that the electrodes are placed along the borderline of an island-formed plasma generation area.

In electrode arrangements of this kind neighbouring electrodes are preferably connected to different voltages. It is even more preferred that, throughout the electrode arrangement, all 3 electrodes in all sets of electrodes consisting of any given electrode and its to neighbouring electrodes are connected to 3 different voltages.

The most preferred electrode arrangement is the one in which the electrodes substantially are placed along a circle, i.e. the borderline of the island-formed area is a circle.

In a particular embodiment of the present invention a magnetic field in applied to the plasma. The magnetic field increases the length of the path that the electrons traverse in the plasma by forcing them into a helicoidal movement around the magnetic field lines. The longer path results in more electron-atom collisions and thus in a more intense plasma (higher ionisation degree). Accordingly, it has been found that the presence of a magnetic field allows generation of plasma having a higher power density at a gas pressure significantly lower than a gas pressure used in the absence of a magnetic field. If on the other hand the magnitude of the applied magnetic field is too high, a significant cooling of the electrons due to the resulting high number of electron-atom collisions may occur. This effect may result in a decrease in plasma intensity or even in extinguishment of the plasma.

The skilled person will, however, be able to select the optimum magnitude of the applied magnetic field according to the desired plasma intensity.

The magnetic field is preferably provided by at least one magnetic dipole which is placed sufficiently near the plasma generation area to allow an interaction between the plasma and the magnetic dipole field. The magnetic field in more preferably provided by a number of magnetic dipolos placed near or at different electrodes. Each of such magnetic dipoles in preferably arranged so that its associated magnetic dipole field has a direction substantially perpendicular to the line defined by the geometric centre of the electrode arrangement and the centre of the electrode on which it is placed. Permanent magnets are the preferred source of magnetic dipole fields.

The electrode system according to the invention may be equipped with a substrate holder placed in the plasma generation area, preferably placed near or at the geometric centre of the electrode arrangement. The potential of the substrate holder may be floating in the plasma. Alternatively, the potential of the substrate holder may be controlled by grounding the substrate holder or by connecting it to ground potential through a DC power supply or an RC circuit, for example as shown in FIG. 4 or by connecting the substrate holder to each of the three voltage. $U_r$, $U_s$ and $U_t$ through diodes, for example as shown in FIGS. 5A and 5B where it should be understood that electric currents run through the diodes in the direction of the arrows.

The method and the electrode system according to the invention is suitable for generating a plasma for a wide range of purposes, including plasma assisted chemical vapour deposition (PA-CVD) processes, plasma processing, such as doping or oxidation of a fibre surface, and cleaning and/or activation of polymer surfaces.

The gas from which the plasma is generated by the method of the invention can be selected among a wide variety of gases or gas mixtures, the exact choice depending of the desired application. When the method is used for cleaning and activation of polymer surfaces the preferred games are air, $CF_4$, and mixtures of oxygen and argon.

The gas from which the plasma in generated is preferably kept at a temperature in the range of 0° to 1500° C. and the gas pressure is preferably between 0.01 and $10^4$ Pa.

BRIEF DESCRIPTION OF THE DRAWINGS

In the following the invention is further illustrated with reference to the drawings, in which.

DETAILED DESCRIPTION

In the following examples different embodiments of the invention are illustrated by plasma assisted chemical vapour deposition processes in which diamond-like carbon (DLC) films are deposited on a substrate using a mixture of $CH_4$ and $K_2$ as process gas.

In all examples the substrate temperature was approximately 350 K.

EXAMPLE 1

Figure 1:
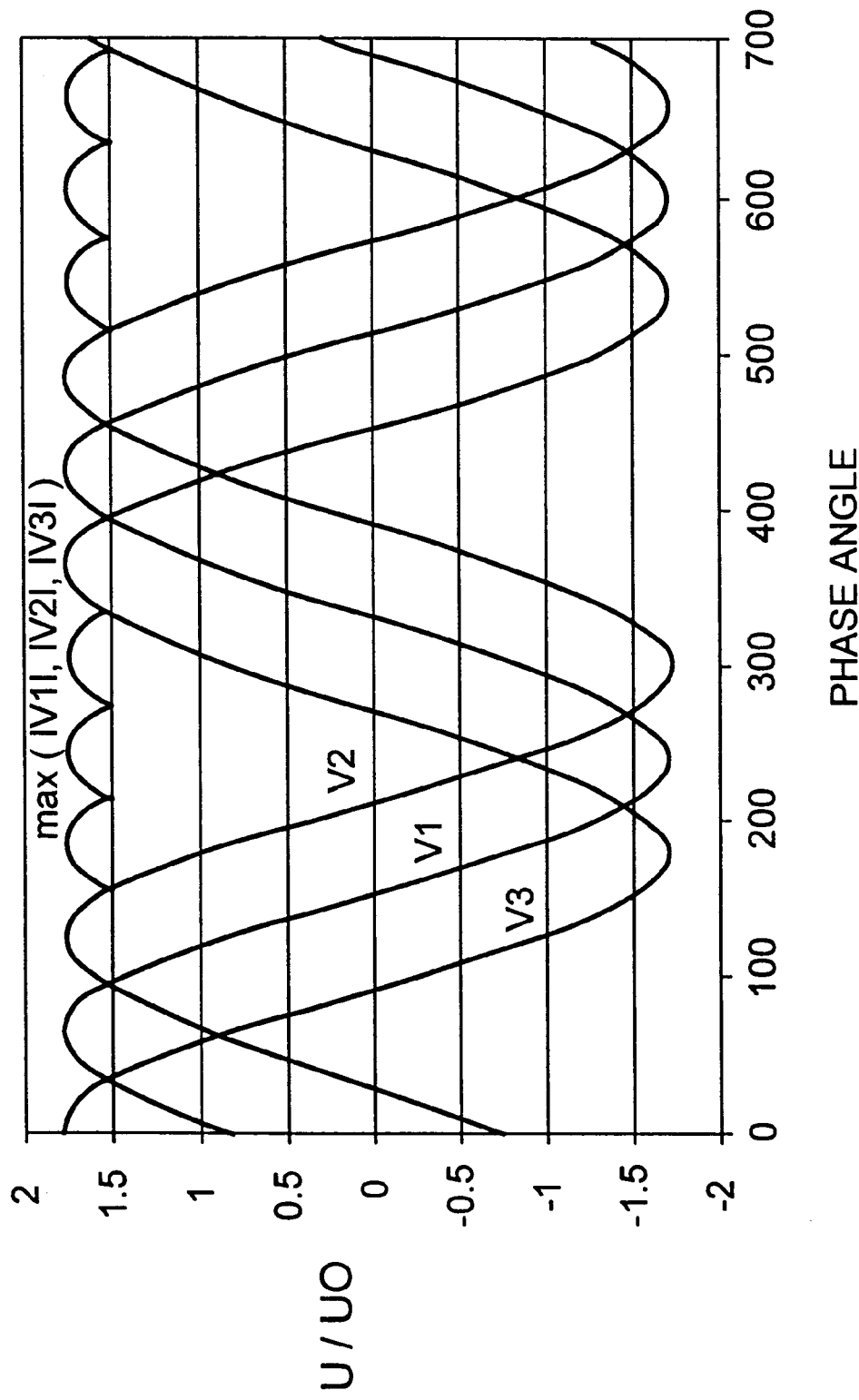
FIG. 1 is a plot of the functions $V_1(t)$, $V_2(t)$, $V_3(t)$ and $\max(|V_1(t)|,|V_2(t)|,|V_3(t)|)(t)$ versus phase angle (phase angle≡$2\pi \cdot f \cdot t$) showing that although $V_1(t)$, $V_2(t)$ and $V_3(t)$ are oscillating functions, $\max(|V_1(t)|,|V_2(t)|,|V_3(t)|)(t)$ remains virtually constant.
Figure 2:
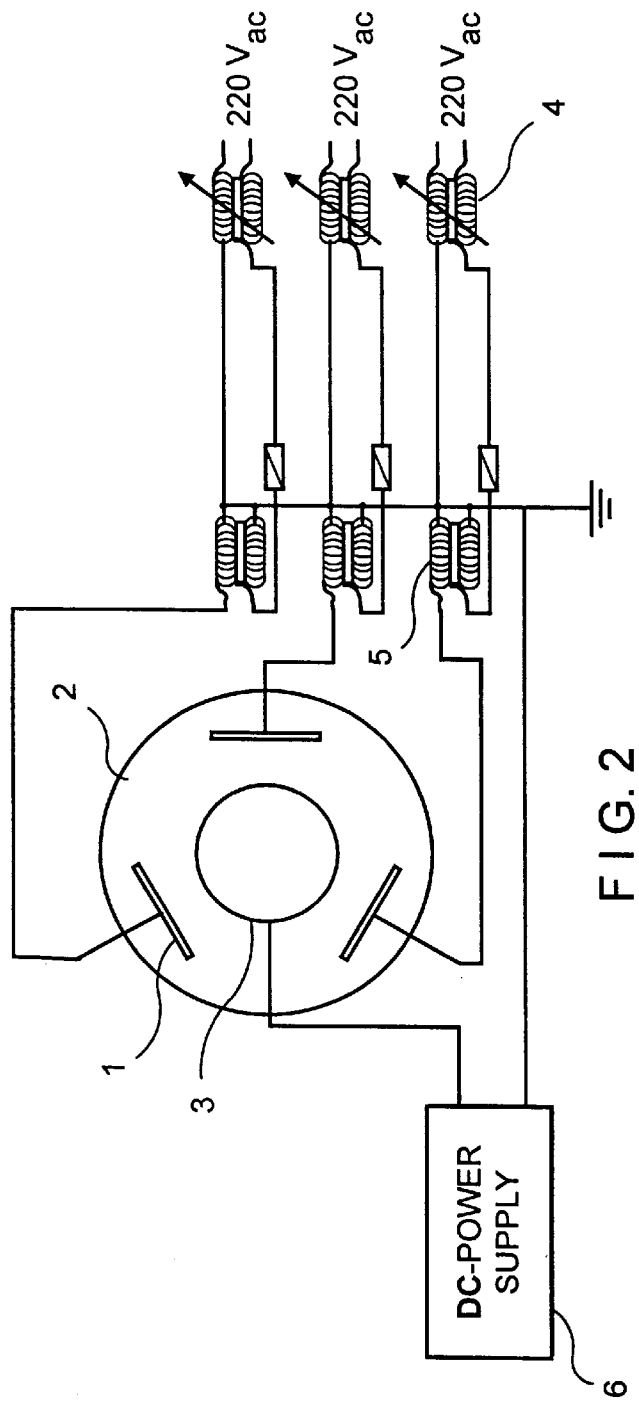
FIG. 2 schematically shows an embodiment of the electrode system according to the invention consisting of three electrodes (1) placed in a vacuum chamber (2) containing a holder (3) for the substrate to be plasma treated. The three voltages $U_R$, $U_S$ and $U_T$ are applied to the electrodes (1) trough step-up transformators (4,5). The substrate is connected to ground potential through a DC power supply (6).

Using an electrode system similar to the one shown in FIG. 2 and the following CVD process parameters

| | |
|---|---|
| $U_{rms}$ | 600 V (on each electrode) |
| $I_{rms}$ | 50 mA (on each electrode) |
| p | 100 Pa |
| $H_2$:$CH_4$ ratio | 0.5 |
| Deposition time | 1200 s | a DLC coating was deposited on a plate-like piece of glass having the following approximate dimensions: 10×10×2 mm.

EXAMPLE 2

Figure 3:
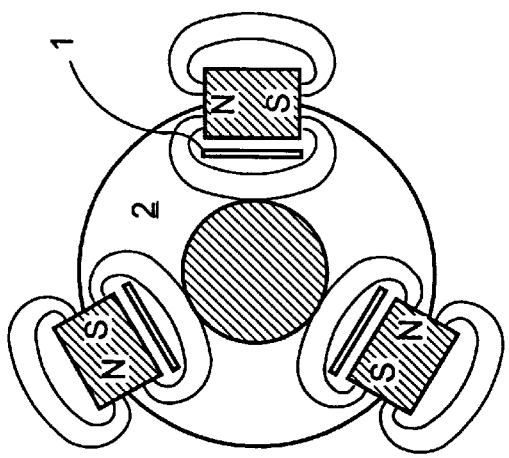
FIG. 3 shows a special embodiment of the electrode system according to the invention comprising three electrodes (1) arranged symmetrically around a substrate holder (2). Each electrode is equipped with a permanent magnet (3) creating a magnetic dipole field in a direction substantially perpendicular to the line defined by the centre of substrate holder (2) and centre of the electrode.
Figure 4:
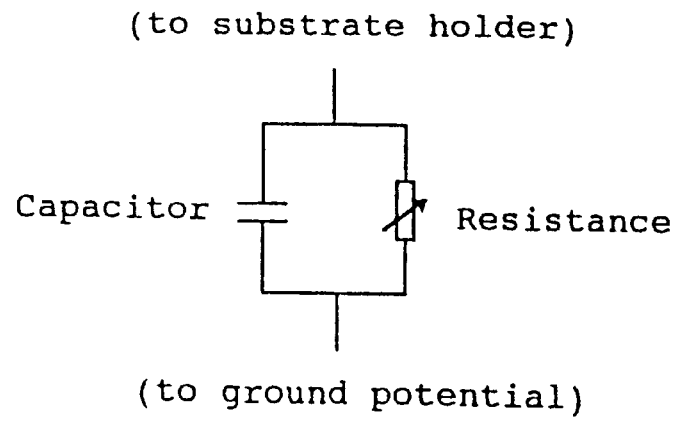
FIG. 4 shows how a substrate holder can be connected to ground potential through an RC circuit.
Figure 5A:
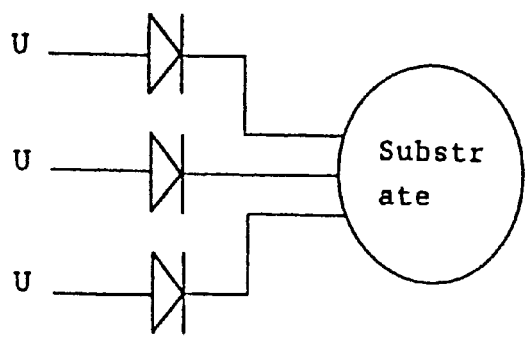
FIGS. 5a and 5b show two examples of how a substrate holder can be connected to three voltages through diodes.
Figure 5B:
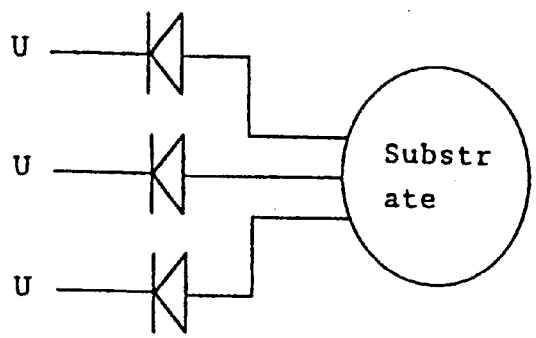

Using an electrode system similar to the one shown in FIG. 3 equipped with standard type ceramic ferrite-strontium permanent magnets (dimensions 1×2×4 cm; the two 2×4 cm areas representing north and south poles, respectively) and the following CVD process parameters

| | |
|---|---|
| $U_{rms}$ | 620 V (on each electrode) |
| $I_{rms}$ | 120 mA (on each electrode) |
| p | 10 Pa |
| $H_2:CH_4$ ratio | 0 |
| Deposition time | 1200 s | a DLC coating was deposited on a plate-like piece of glass having the following approximate dimensions: 10×10×2 mm.

What is claimed is:

1. A method for excitation of a plasma, which comprises the step of subjecting a gas to an electric field generated by an electrode system comprising n electrodes, n being an integer greater than or equal to 3, each of the n electrodes being connected to one of the following AC voltages:

$$U_r(t)=U_0 sin(2\pi f t)$$
$$U_s(t)=U_0 sin(2\pi f t + \frac{2\pi}{3})$$
$$U_t(t)=U_0 sin(2\pi f t - \frac{2\pi}{3})$$

where:
- f is a frequency in the range of 10 to 10000 Hz,
- $U_o$ is a voltage in the range of 50 to 10000 V,
- at least one electrode being connected to $U_r$, at least one electrode being connected to $U_s$ and at least one electrode being connected to $U_t$ such that application of the three voltages $U_r$, $U_s$ and $U_t$ to the electrodes produces a virtual DC plasma.

2. A method according to claim 1, characterized in that the electrode system comprises i electrodes connected to $U_r$, j electrodes connected to $U_s$ and k electrodes connected to $U_t$, where i, j and k are integers from 1 to 28, i+j+k=n and i≧j≧k, and that i−j<5 and j−k<5.

3. A method according to claim 1, characterized in that the n electrodes are present in n/3 sets of 3 electrodes connected to $U_r$, $U_s$ and $U_t$, respectively.

4. A method according to claim 1, characterized in that the electrodes are arranged so that the plasma essentially is surrounded by electrodes.

5. A method according to claim 4, characterized in that the electrodes are placed along the borderline of an island-formed plasma generation area.

6. A method according to claim 5, characterized in that, throughout the electrode arrangement, neighbouring electrodes are connected to different voltages.

7. A method according to claim 1, characterized in that a magnetic field in applied to the plasma.

8. A method according to claim 7, characterized in that the magnitude of the applied magnetic field is chosen so as to obtain an increase in the plasma power density.

9. A method according to claim 7, characterized in that, the magnetic field is provided by at least one magnetic dipole placed near the plasma.

10. A method according to claim 9, characterized in that each magnetic dipole is placed on an electrode and arranged so that its associated magnetic dipole field has a direction substantially perpendicular to the line defined by the geometric centre of the electrode arrangement and the centre of the electrode on which it is placed.

11. An electrode system for carrying out the method according to claim 1 for excitation of a plasma, characterized in that it comprises n electrodes, arranged so as to obtain a plasma generation area, n being greater than or equal to 3, that each of the n electrodes is connected to one of the following AC voltages:

$$U_r(t)=U_0 sin(2\pi f t)$$
$$U_s(t)=U_0 sin(2\pi f t + \frac{2\pi}{3})$$
$$U_t(t)=U_0 sin(2\pi f t - \frac{2\pi}{3})$$

where f and $U_0$ are as defined in claim 1, and that at least one electrode is connected to $U_r$, at least one electrode is connected to $U_s$ and at least one electrode is connected to $U_t$.

12. An electrode system according to claim 11, characterized in that it further comprises a substrate holder placed in the plasma generation area.

13. An electrode system according to claim 12, characterized in that the substrate holder is connected to ground potential, through a DC power supply or an RC circuit.

14. An electrode system according to claim 12, characterized in that the substrate holder is connected to each of the three voltages $U_r$, $U_s$ and $U_t$ through diodes.

15. A method according to claim 5, characterized in that the electrodes substantially are placed along a circle.

16. A method according to claim 6, characterized in that, throughout the electrode arrangement, all 3 electrodes in all sets of electrodes consisting of any given electrode and its two neighbouring electrodes are connected to 3 different voltages.

17. A method according to claim 9, characterized in that the magnetic field is provided by a number of magnetic dipoles placed near or at different electrodes.

18. An electrode system according to claim 12, characterized in that the substrate holder is placed near or at the geometric centre of the electrode arrangement.

* * * * *